United States Patent [19]

Telewski et al.

[11] 4,129,897
[45] Dec. 12, 1978

[54] MODULAR MOUNTING APPARATUS FOR SUBSTRATE MEANS BEARING PLANAR CIRCUIT MEANS

[75] Inventors: Fred J. Telewski; Carlos L. Beeck; Philip B. Snow, all of Beaverton, Oreg.

[73] Assignee: Tektronix, Inc., Beaverton, Oreg.

[21] Appl. No.: 870,302

[22] Filed: Jan. 18, 1978

Related U.S. Application Data

[63] Continuation of Ser. No. 633,742, Nov. 20, 1975, abandoned.

[51] Int. Cl.$^2$ ............................................. H05K 1/04
[52] U.S. Cl. .................................. 361/399; 361/324; 333/84 M
[58] Field of Search ............... 361/399, 395, 400, 424; 333/84 M, 97 R; 174/35 GC

[56] References Cited

U.S. PATENT DOCUMENTS

| | | | |
|---|---|---|---|
| 3,549,949 | 12/1970 | Grandberry | 361/395 |
| 3,784,726 | 1/1974 | Smith et al. | 361/399 |
| 3,875,541 | 4/1975 | Schioberg | 174/35 GC |

Primary Examiner—David Smith, Jr.
Attorney, Agent, or Firm—Adrian J. La Rue

[57] ABSTRACT

A modular mounting apparatus for substrate means bearing planar circuit means is provided and includes a design of components that assemble into a housing package for microcircuit modules with means for locating, supporting, interconnecting and housing them; in an interference free environment, i.e., provisions for moisture, radio frequency interference and electromagnetic interference sealing are provided. The apparatus provides a modular systematic and economical means of packaging for low frequency printed circuit boards to microwave frequency microcircuits.

4 Claims, 3 Drawing Figures

MODULAR MOUNTING APPARATUS FOR SUBSTRATE MEANS BEARING PLANAR CIRCUIT MEANS

This is a continuation of application Ser. No. 633,742 filed Nov. 20, 1975, now abandoned.

BACKGROUND OF INVENTION

Heretofore prior art packaging schemes for utilizing substrate means bearing planar circuit means and operating in the microwave frequencies has been to install such substrates into a reversible protrusion box or cavity of a milled out material using a paste down method such as conductive glue, epoxy sheet or indium solder. These methods work, but it is very difficult or in some instances impossible to repair or replace the substrates.

Other prior art utilizes press down retainers, some of which include an embossed or quilted foil on the metalized side of the substrate, to install the substrates into a box or cavity. The press-down method is satisfactory where small substrates are employed, but are unsatisfactory when large substrates are used and will, environmentally speaking, deteriorate in time.

SUMMARY OF INVENTION

According to the present invention, the disadvantages of the prior art are overcome by providing a modular mounting apparatus for substrate means bearing planar circuit means wherein an economical nonreversible precision extrusion is cut to length, milled, drilled and tapped to accept cast precision end plates or side plates with attached signal conductors such as coaxial cables and feed-thru capacitors. A strip of elastomeric conductive material is inserted to provide a cushion and grounding support for the metalized hybrid substrates; held, making intimate contact to a ground plane, by means of chemically milled one-piece retainer clips with integral cantilever toothed spring end means. Signal and power interconnections are made by means of: parallel gap welding a thin gold ribbon to the coaxed lines, to other substrates, or to a center conductor of terminals that are secured to the housing. The assembly is closed by means of either a mesh strip or conductive elastomer seal and a lid carrying suitable absorber pads where needed and then fastened to the housing.

It is therefore an object of the present invention to provide a systematic, economical means of packaging microcircuits which provide an advanced means of providing highly efficient interconnections.

It is another object of the present invention to provide a systematic, economical means of packaging microcircuits using modular components;

It is yet another object of the present invention to provide a systematic, economical means of packaging microcircuits having modularity, serviceability and compactness.

The subject matter of the present invention is particularly pointed out and distinctly claimed in the concluding portion of this specification. The invention, however, both as to organization and method of operation, together with further advantages and objects thereof may best be understood by reference to the following description taken in connection with the accompanying drawings wherein like reference characters refer to like elements.

DETAILED DESCRIPTION OF THE INVENTION

Figure 1:
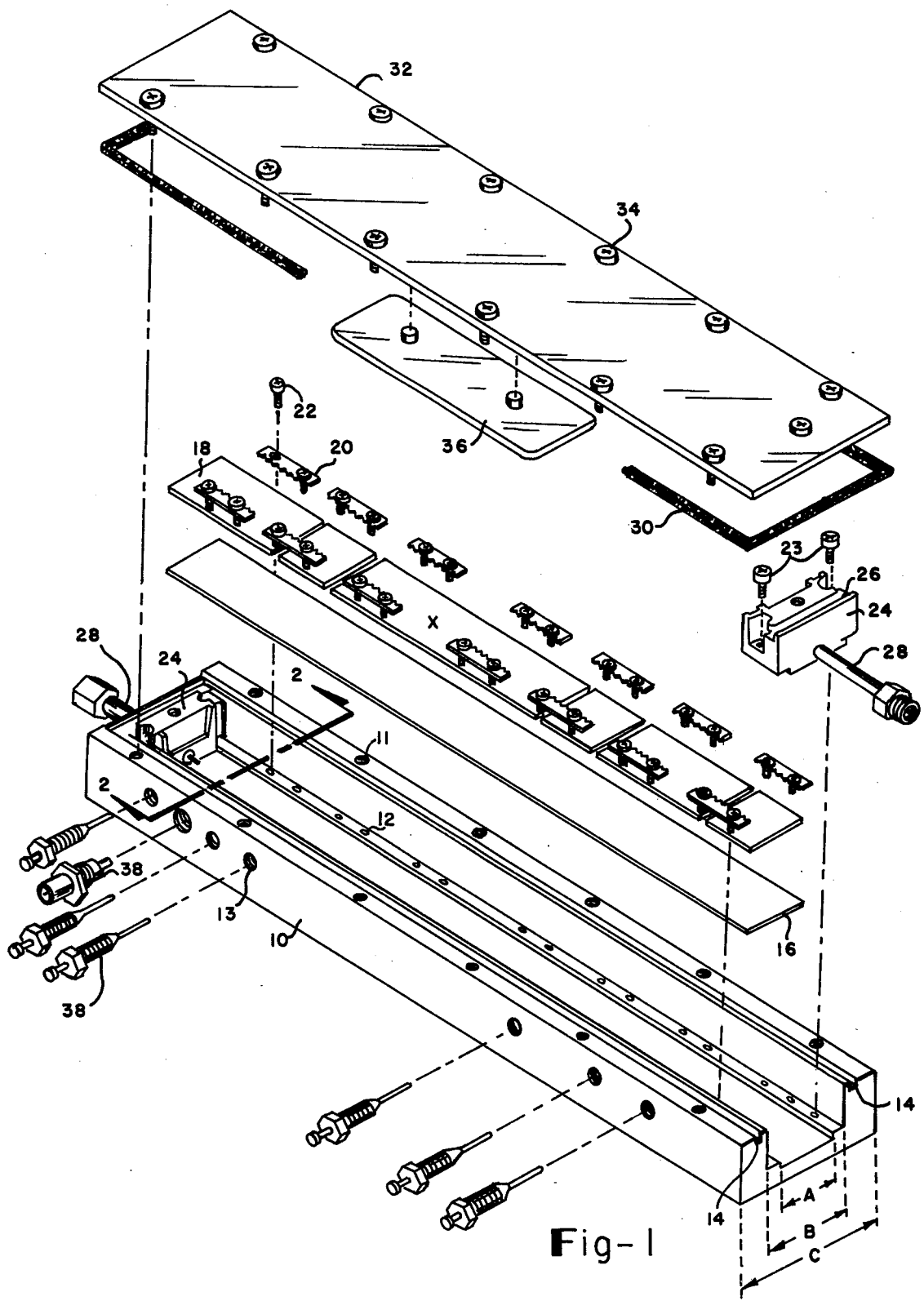
FIG. 1 is an exploded view of an apparatus according to the present invention.

Referring to the drawings, and in particular to FIG. 1, there is shown in exploded view, a modular mounting apparatus for substrate means bearing planar circuit means according to the present invention. A nonreversible housing means 10, cut to a desired length depending upon the number of planar circuit bearing substrates required, is milled in a channel shaped configuration from a suitable material such as aluminum. The housing means is drilled and tapped to provide a plurality of attachment means 11, 12 and access parts 13 (optional). A groove 14 is disposed in and traverses along both sides of the housing means and is provided for receiving a means for sealing the apparatus which will be described elsewhere in this specification.

A conductive elastomeric material 16 is next provided for disposal into a portion A of the channel shaped housing member. The elastomeric material is preferably silver powdered silicone rubber having a low durometer rating so that it is easily formed. The elastomeric material provides a cushion and grounding support for the substrates to be hereinafter discussed, as well as for conduction of heat from the substrates for dissipation in the housing. Also disposed in the A portion of the channel shaped housing means are the substrates 18. These substrates are removably disposed in the housing means by securing means 20, which, are retainer clips with integral cantilever tooth spring end means and secured by conventional screw means 22 threaded into attachment means 12 in the area B of the channeled housing means. These substrates are preferable ceramic and have a metalized underside (not shown) for well known reasons. Additionally, these substrates could be, say, an etched circuit board. Although not shown, these substrates have planar circuitry thereon such as amplifiers, oscillators, etc. The drawing shows 6 such substrates adjacent one another of various lengths and are shown as illustration only. Once the substrates are disposed and secured to the housing means 10, the elastomeric material provides the ground support to the ground or ground plane (the bottom of the housing means).

Next provided are a pair of access means 24 milled from a suitable material, preferrably zinc. These access means are placed adjacent the outer two substrates and provide for communication with the planar circuits, i.e., electrically connections. These access means are removably secured and selectively positioned in and along the housing means in the portions A and B by conventional screws 23 threaded into the attachment means 12 in the portion B. They also include a groove 26, similar to the groove 14, for receiving the means for sealing the apparatus. Each access means includes signal conductors 28 for providing an input signal to the planar circuits on the substrates and for taking an output signal from the apparatus such as conventional BNC or UHF type connector systems having an insulated center conductor and a grounded outer conductor.

A seal 30, which is preferably an absorber for radio frequency interference, is a woven mesh but which can be a conductive elastomeric material for moisture considerations, is next provided for disposal into the groove 14 and the groove 26. Once installed, this seal completely surrounds the channel shaped housing means in the area or portion generally donated C and extends slightly above the upper surface of the housing means. Once the seal 30 has been installed, a removable cover 32 is disposed along and over the channel shaped housing means and the access means and removably secured thereto by further conventional screws 34 threaded into attachment means 11 in portion C of the housing means.

As can be discerned from this drawing, a modular mounting apparatus for substrate means bearing planar circuit means including a housing means, means including the substrate means bearing the planar circuit means, and means removably disposed along both the housing means and the access means which permits removal and replacement of the substrate is provided. This, of course, is an object of the subject invention.

As can also be discerned from the drawing of FIG. 1, the apparatus may also include an additional member 36 defining a mode suppressor and is preferably an epoxy iron powder loaded lossy dielectric or similar member for absorbing both radio frequency energy and electromagnetic energy. This member is secured to cover member 32. For example, assume that the substrate marked X included a planar circuit such as an oscillator operating in the microwave frequency range. Member 36 would be secured to cover member 32 directly above substrate X so that when cover member 36 is secured to the housing means 10 the absorber would prevent radiation therefrom. Member 36 in the preferred embodiment is secured to the cover with an epoxy adhesive.

Also shown in FIG. 1 are a plurality of additional access means 38 for disposal into access ports 13. Additional signal, power, etc. connections may be made to the planar circuits by parallel gap welding a thin gold ribbon to the circuit leads. These additional access means could be, for example, BNC or UHF connectors or feed-thru capacitors, i.e., filters.

Figure 2:
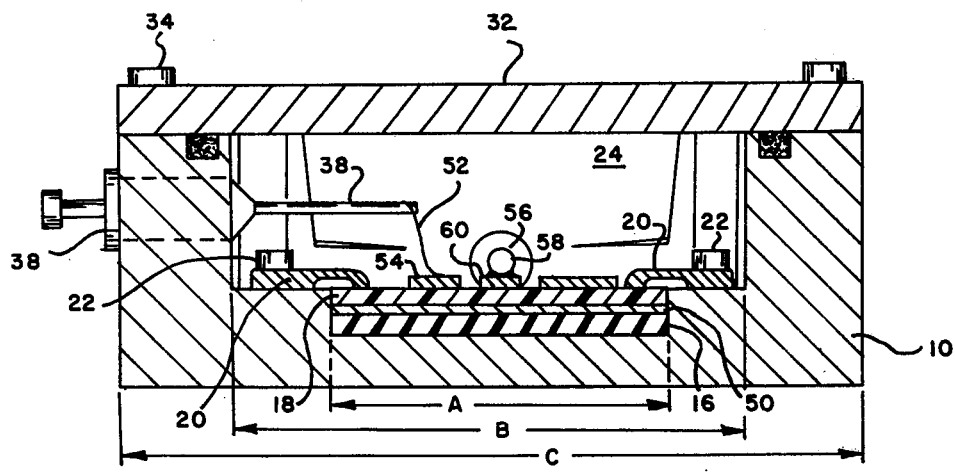
FIG. 2 is a cross-sectioned view of the embodiment of FIG. 1 with the components inserted.

Referring now to FIG. 2, there is shown a cross sectional view of the apparatus shown in FIG. 1, taken along the line 2—2 thereof. This drawing includes the various components disposed into the housing means 10. As was previously stated, the elastomeric material 16 is disposed into the portion A of the channel shaped housing means and the substrate 18 disposed on the elastomeric material. This figure shows the metalized underside 50 of the substrate 18 as previously stated. As can be discerned from this drawing, the total thickness of the elastomeric material 16, and substrate 18 extend above the A portion of the channel shaped housing means; this enables the spring end means of the securing means 20 to provide sufficient pressure on the combined units to securely hold them in place. Also shown in this drawing is, say, a gold ribbon 52 which is welded to a lead 54 on the substrate 18 for providing additional electrical access to the apparatus via access means 38. It should be emphasized that the lead 54 could be a transmission line, a circuit component, etc. Also shown in the drawing is the inside portion of the means 24 for providing input signals to or taking output signals from the apparatus which comprises an insulative portion 56 and a inner conductive portion 58 which is soldered to another unit 60 which, like 54, is part of the planar circuit.

Figure 3:
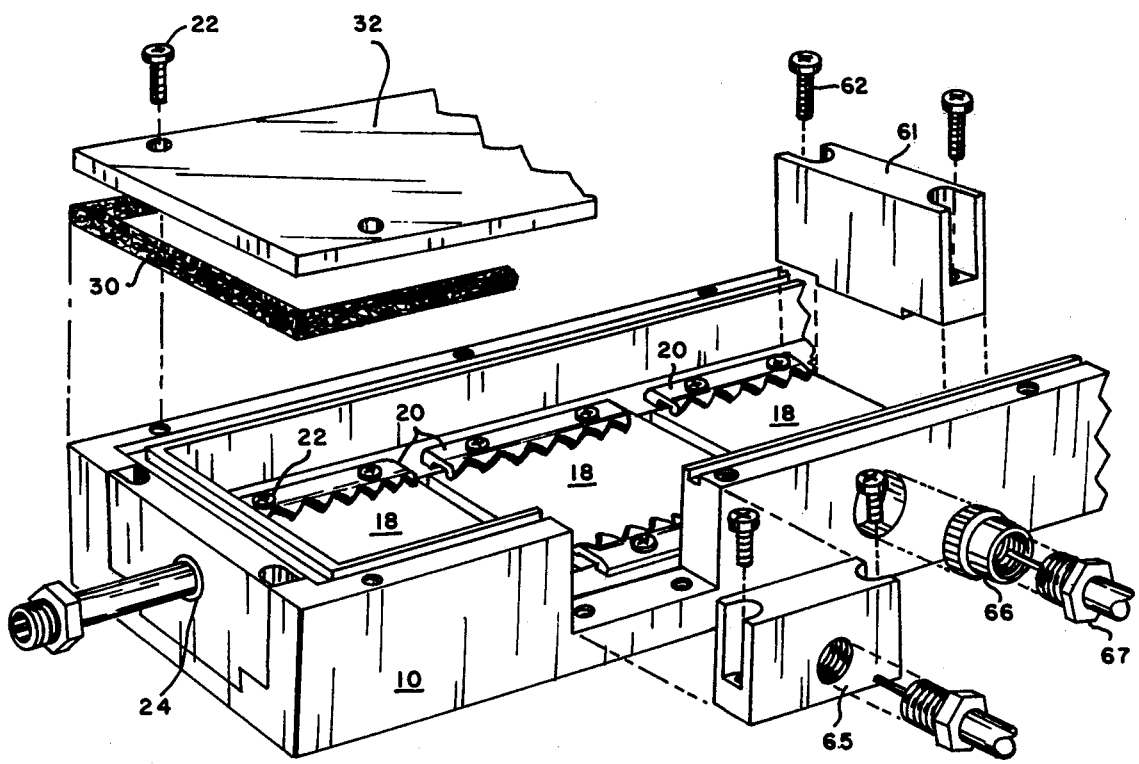
FIG. 3 is a partial view of a second apparatus according to the present invention.

Referring now to FIG. 3, there is shown a partial view of another embodiment of the apparatus according to the present invention. This embodiment includes the housing means 10, a removable cover 32, sealing means 30, access means 24, substrate 18, securing means 20 and the various screw means. Additionally, there is shown an isolation means 61 which is removably received in the channel shaped housing means. The isolation means is similar to the access means 24; the difference is, however, that the isolation means provides no means for providing input signals or means for taking output signals from the apparatus. The isolation means 61 is removably received in the housing and secured thereto by the securing means 62 threaded into the attachment means 11 (not shown). The isolation means 61 is generally used between two adjacent substrates. Also shown in the FIG. 3 embodiment is a further accessing means 65. Accessing means 65 enables signal inputs and outputs from the side of the housing means, rather than the ends of the housing means. Side accesses, such as the accessing means 65, enable, say, the access means 24 to be replaced by an isolation means 61 whenever desired. A still further type of additional access means are the units 66, 67 which are similar to a bushing or sleeve and insert.

As has been previously stated, the substrates are in communication with the bottom portion of the channel shaped housing means via the elastomeric material to provide both a cushion and a ground (electrically). Additionally, conductive portions of the access means such as the gold ribbons are in ungrounded (electrically) communication with the planar circuits. This, therefore, provides for signal conduction via transmission means which have a grounded outer conductor and conductive inner conductor.

While there has been shown and described the preferred embodiments of the present invention, it will be apparent to those skilled in the art that many changes and modifications may be made without departing from the invention in its broader aspects. For example, it is well known that both sides of the substrates may be utilized i.e., bear planar circuits. To utilize such a substrate, the elastomeric material is simply perforated where contact is not desired leaving an air gap between the planar circuit and the bottom of the channel shaped housing means. Therefore, the appended claims are intended to cover all such changes and modifications that fall within the true spirit and scope of the invention.

The invention is claimed in accordance with the following:

1. A modular package in which planar circuit means are mounted, comprising:
   housing means having side walls and a bottom defining a channel-shaped configuration and having a predetermined variable length;
   elastomeric conduction means in engagement with said bottom and extending substantially along the length thereof;
   substrate means containing planar circuit means on at least the upper surface means thereof and ground circuit means provided on the bottom surface thereof, said ground circuit means electrically engaging said elastomeric conduction means;
   removable substrate securing means extending between said housing means and said substrate means urging said ground circuit means into electrical connection with said elastomeric conduction means and said elastomeric conduction means providing cushion means therefor;

removable connection means provided by said housing means electrically connected respectively to said planar circuit means on said upper surface means and to said ground circuit means on said lower surface means; and means sealing said substrate means so as to be free from interfering signals.

2. The apparatus according to claim 1 further comprising:

removable isolation means disposed along the length of said housing means permitting a plurality of said substrate means.

3. The apparatus according to claim 1 wherein said removable connection means are connected to said planar circuit means and located in end means of said housing means.

4. The apparatus according to claim 3 wherein said removable connection means are located in at least one of said side walls of said housing means.

* * * * *